(12) United States Patent
Fukunaga

(10) Patent No.: US 10,405,458 B2
(45) Date of Patent: Sep. 3, 2019

(54) FITTING ASSEMBLY AND ELECTRONIC DEVICE

(71) Applicant: FUJITSU LIMITED, Kawasaki-shi, Kanagawa (JP)

(72) Inventor: Naomi Fukunaga, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/440,457

(22) Filed: Feb. 23, 2017

(65) Prior Publication Data
US 2017/0257980 A1 Sep. 7, 2017

(30) Foreign Application Priority Data
Mar. 7, 2016 (JP) ................................ 2016-043448

(51) Int. Cl.
| | |
|---|---|
| *H05K 7/20* | (2006.01) |
| *H01R 13/00* | (2006.01) |
| *H01R 13/24* | (2006.01) |
| *H01R 13/631* | (2006.01) |
| *F16L 37/40* | (2006.01) |

(52) U.S. Cl.
CPC .......... *H05K 7/20272* (2013.01); *F16L 37/40* (2013.01); *H01R 13/005* (2013.01); *H01R 13/2478* (2013.01); *H01R 13/6315* (2013.01); *H05K 7/20781* (2013.01)

(58) Field of Classification Search
CPC ................................................ H05K 7/20272
USPC ........................................................ 174/59
See application file for complete search history.

(56) References Cited

U.S. PATENT DOCUMENTS

| | | | | |
|---|---|---|---|---|
| 2,510,125 A | * | 6/1950 | Meakin | F16L 37/127 174/21 JS |
| 4,625,746 A | * | 12/1986 | Calvin | F16K 17/40 137/556.3 |
| 2003/0100209 A1 | * | 5/2003 | Kerscher | F16L 25/01 439/191 |
| 2009/0068870 A1 | * | 3/2009 | Mezhinsky | G02B 6/3882 439/247 |
| 2010/0027941 A1 | * | 2/2010 | Stewart | G02B 6/3817 385/57 |
| 2014/0151999 A1 | * | 6/2014 | Imaki | F16L 37/56 285/119 |
| 2017/0187143 A1 | * | 6/2017 | Vassg Rd | H01R 13/523 |
| 2017/0202128 A1 | * | 7/2017 | Emmert | A01B 59/043 |

FOREIGN PATENT DOCUMENTS

| | | | | |
|---|---|---|---|---|
| JP | 2003-243095 A | | 8/2003 | |
| JP | 2012-026470 A | * | 2/2012 | ............. F16L 37/02 |

* cited by examiner

*Primary Examiner* — Stanley Tso
(74) *Attorney, Agent, or Firm* — Fujitsu Patent Center

(57) ABSTRACT

A fitting assembly including: a movable connector block including a connector coupler to which a connector is to be coupled, the movable connector block configured to be supported by a base; a floating support configured to support the movable connector block swingably together with the base; and a protrusion provided to one of the movable connector block and the base, the protrusion including a tip end that, when the connector is coupled to the connector coupler, comes into contact, in a connecting direction to the connector, with the other one of the movable connector block and the base, and swingably supports the movable connector block pivotally about the tip end.

17 Claims, 11 Drawing Sheets

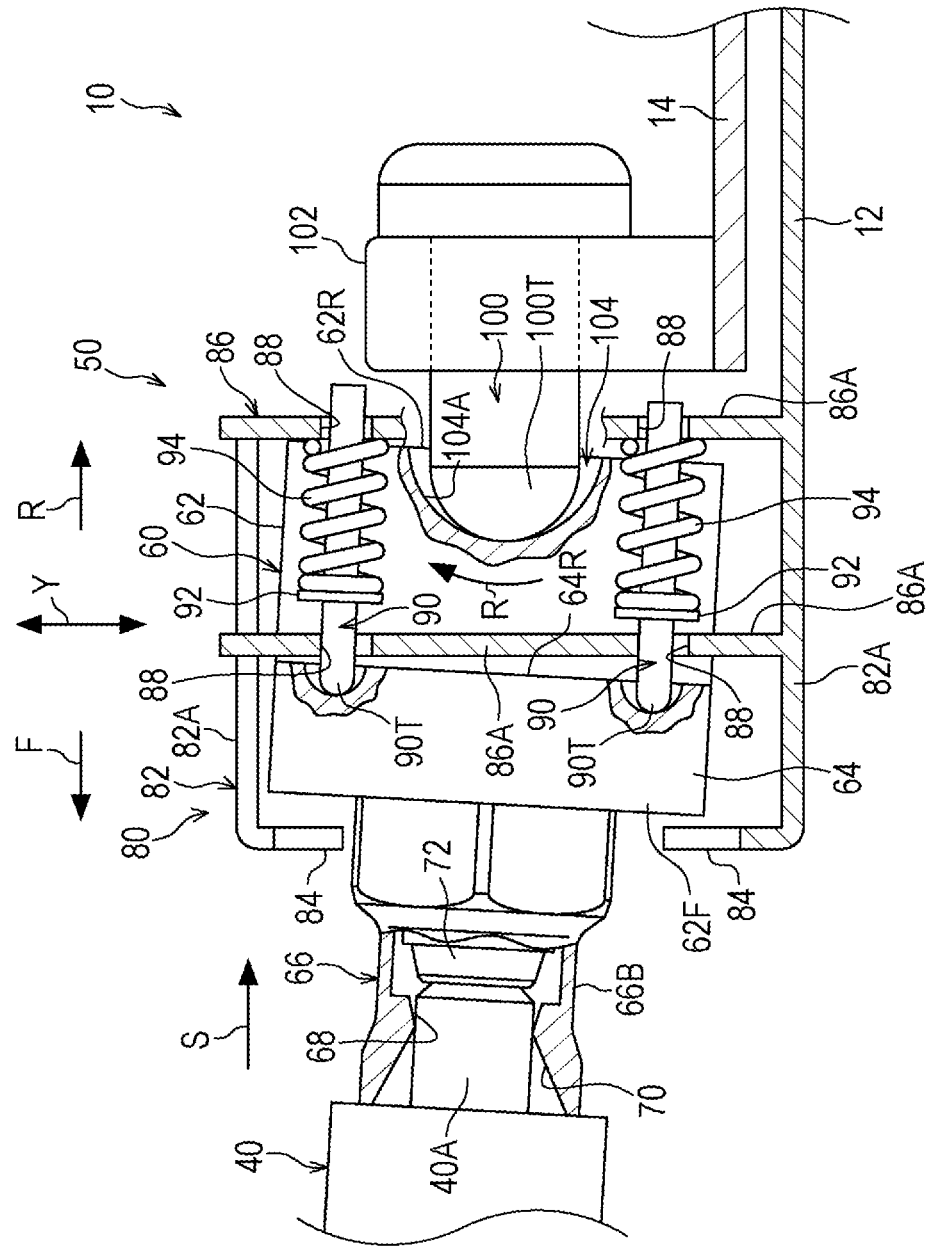

US 10,405,458 B2

FITTING ASSEMBLY AND ELECTRONIC DEVICE

CROSS-REFERENCE TO RELATED APPLICATION

This application is based upon and claims the benefit of priority of the prior Japanese Patent Application No. 2016-043448, filed on Mar. 7, 2016, the entire contents of which are incorporated herein by reference.

FIELD

The embodiment discussed herein is related to a fitting assembly for a connector and an electronic device using it.

BACKGROUND

There is a movable connector (a floating connector) attached to a base and configured to connect piping to feed a fluid therein (see Japanese Laid-open Patent Publications Nos. 2003-243095 and 2012-026470, for example).

The movable connector of this type is swingably supported by the base through a floating support. The floating support includes, for example, ball plungers which are disposed between the movable connector and the base. Each ball plunger includes a cylindrical body, a movable pin projecting from one end portion of the cylindrical body, and a coil spring provided inside the cylindrical body and configured to bring the movable pin into pressure contact with the base by biasing the movable pin.

In the above-described floating support, when a counterpart connector is inserted obliquely into the movable connector, for example, any of the movable pins of the ball plungers is pressed into the corresponding cylindrical body. As a consequence, the movable connector is oriented to the counterpart connector and the counterpart connector becomes connectable to the movable connector.

In the above-described floating support, however, when the counterpart connector is pressed into and thus connected to the movable connector, the movable pins of the ball plungers are pressed into the cylindrical bodies, and the floating support is locked. In other words, the movable connector is no longer swingable relative to the base.

As a consequence, if the counterpart connector being connected to the movable connector is displaced relative to the movable connector due to, for example, vibration or the like, the movable connector may fail to follow the displacement of the counterpart connector, and therefore have damage or the like.

In one aspect, an object of the technique disclosed in this application is to make a movable connector swingable in a state where another connector is connected to the movable connector.

SUMMARY

According to an aspect of the invention, a fitting assembly including: a movable connector block including a connector coupler to which a connector is to be coupled, the movable connector block configured to be supported by a base; a floating support configured to support the movable connector block swingably together with the base; and a protrusion provided to one of the movable connector block and the base, the protrusion including a tip end that, when the connector is coupled to the connector coupler, comes into contact, in a connecting direction to the connector, with the other one of the movable connector block and the base, and swingably supports the movable connector block pivotally about the tip end.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8B is a side view illustrating a state after the fluid connector of the information processing device is connected to the fitting unit depicted in FIG. 2.

DESCRIPTION OF EMBODIMENT

An embodiment of the technique disclosed in the present application will be described below.

(Electronic Device)

Figure 1:
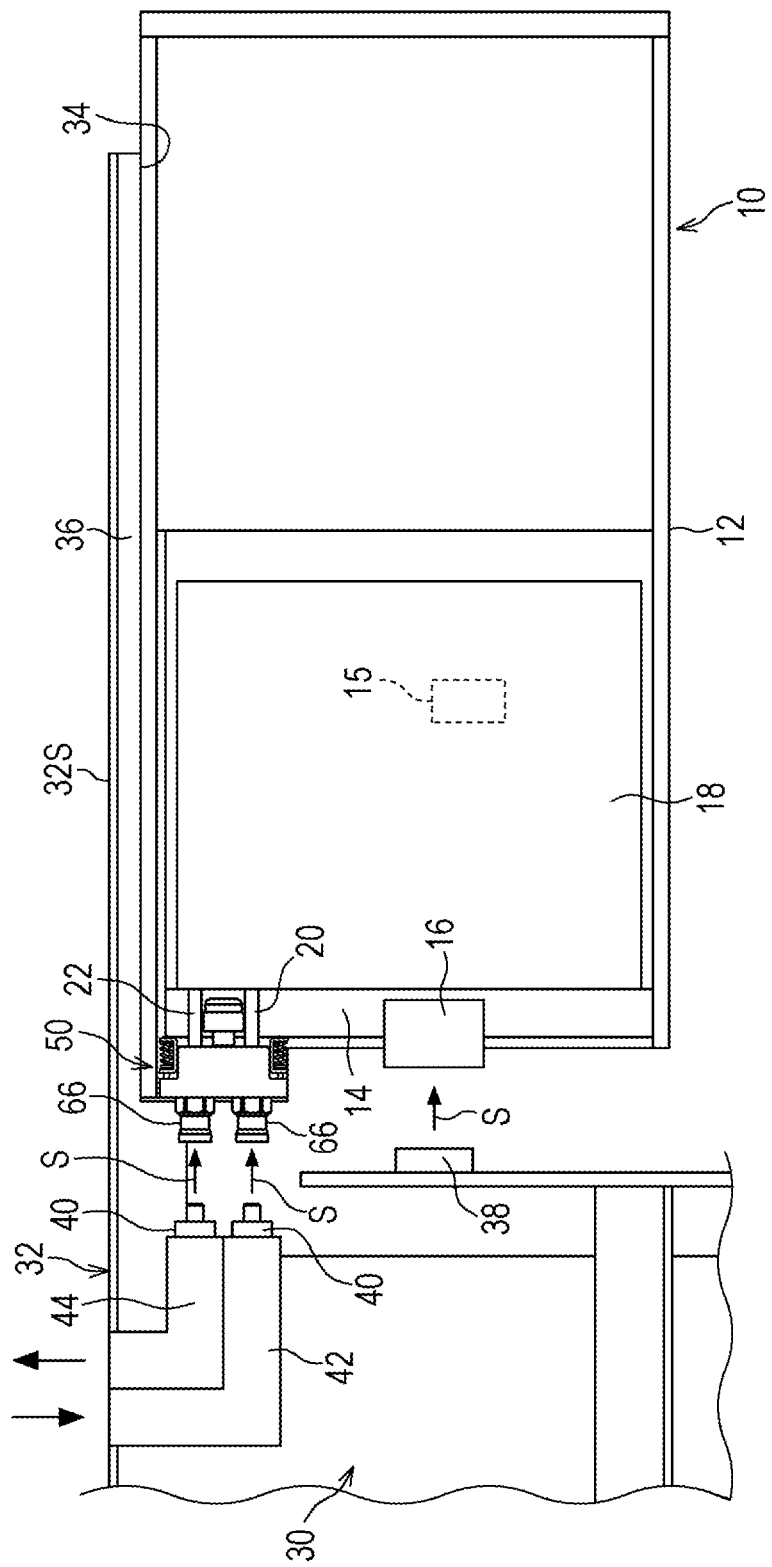
FIG. 1 is a plan view illustrating an electronic device and an information processing device according to an embodiment.

As illustrated in FIG. 1, a fitting unit 50, also called as a fitting assembly 50, of this embodiment is mounted on an electronic device 10. The electronic device 10 is an electronic unit to be housed in an information processing device 30 such as a server device.

The electronic device 10 includes a housing 12, a printed wiring board 14, and a cooler 18. The housing 12 is formed into a flat box shape, for example. The printed wiring board 14 and the cooler 18 are housed in the housing 12. Note that each of the housing 12 and the printed wiring board 14 represents an example of a base.

An electronic component 15 such as a CPU and a memory is mounted on the printed wiring board 14. Moreover, an electric connector 16 is mounted on one end portion of the printed wiring board 14. The electric connector 16 is electrically connected to the electronic component 15 mounted on the printed wiring board 14. The cooler 18 is disposed on the printed wiring board 14.

The cooler 18 is a liquid-cooled heat exchanger such as a cold plate (a cooling plate). The cooler 18 is disposed so as to be capable of exchanging the heat with the printed wiring board 14. Then, the printed wiring board 14 is cooled by causing a refrigerant that flows in the cooler 18 to exchange the heat with the printed wiring board 14.

End portions on one side of a refrigerant supply pipe 20 and a refrigerant discharge pipe 22 are connected to the cooler 18, respectively. The refrigerant supply pipe 20 supplies the refrigerant into the cooler 18. On the other hand, the refrigerant discharge pipe 22 discharges the refrigerant in the cooler 18 to the outside. Each of the refrigerant supply pipe 20 and the refrigerant discharge pipe 22 is formed from a flexible metal pipe or a rubber tube, for example. Meanwhile, end portions on the other side of the refrigerant supply pipe 20 and the refrigerant discharge pipe 22 are connected to the fitting unit 50, respectively. Note that the refrigerant supply pipe 20 and the refrigerant discharge pipe 22 represent an example of piping.

The fitting unit 50 is attached to one end side of the housing 12. The fitting unit 50 includes a pair of fluid connectors 66. The pair of fluid connectors 66 is connected to a pair of fluid connectors 40 of the information processing device 30 to be described later. Note that arrows S indicated in the drawings represent a direction to connect the pair of fluid connectors 40 to the pair of the fluid connectors 66 (hereinafter referred to as a "connector connecting direction"). Meanwhile, a configuration of the fitting unit 50 will be described later.

(Information Processing Device)

The information processing device 30 includes a housing 32, an electric connector 38, and the pair of fluid connectors 40. The housing 32 is formed into a box shape, for example. A housing port 34 used to house the electronic device 10 is formed either in a front surface or a rear surface of the housing 32. Meanwhile, a guide rail 36 to guide the electronic device 10 into the housing 32 is provided on a side wall portion 32S of the housing 32. The electric connector 38 and the pair of fluid connectors 40 are provided inside the housing 32.

The electric connector 38 is electrically connected to a not-illustrated printed wiring board housed in the housing 32. The electric connector 16 of the electronic device 10 is connected to the electric connector 38. Note that a direction to connect the electric connector 38 to the electric connector 16 is the same direction as the connector connecting direction (the direction of the arrows S).

The pair of fluid connectors 66 of the electronic device 10 is connected to the pair of fluid connectors 40. A refrigerant supply pipe 42 is connected to one of the pair of fluid connectors 40, and a refrigerant discharge pipe 44 is connected to the other fluid connector 40. Moreover, a not-illustrated refrigerant cooling device to cool the refrigerant is connected to the refrigerant supply pipe 42 and the refrigerant discharge pipe 44. Then, the refrigerant cooled by the refrigerant cooling device is supplied to the cooler 18 of the electronic device 10 through the refrigerant supply pipe 42, the one fluid connector 40, one of the fluid connectors 66, and the refrigerant supply pipe 20.

After the refrigerant supplied to the cooler 18 exchanges the heat with the printed wiring board 14, the refrigerant is discharged to the refrigerant cooling device through the refrigerant discharge pipe 22, the other fluid connector 66, the other fluid connector 40, and the refrigerant discharge pipe 44. The printed wiring board 14 is cooled by circulating the refrigerant between the cooler 18 and the refrigerant cooling device as described above.

(Fitting Unit)

Figure 2:
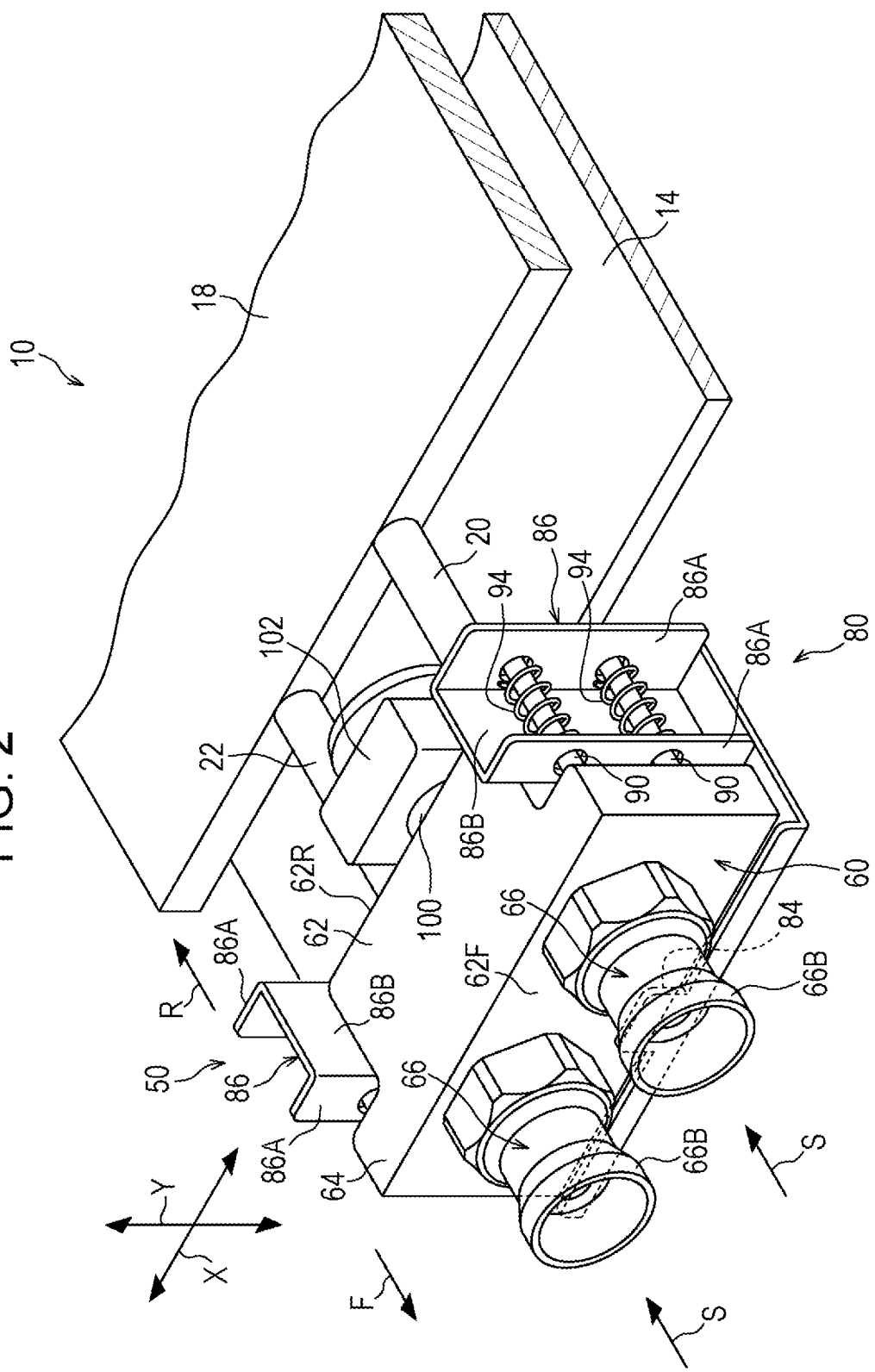
FIG. 2 is a perspective view illustrating a fitting unit depicted in FIG. 1.
Figure 3:
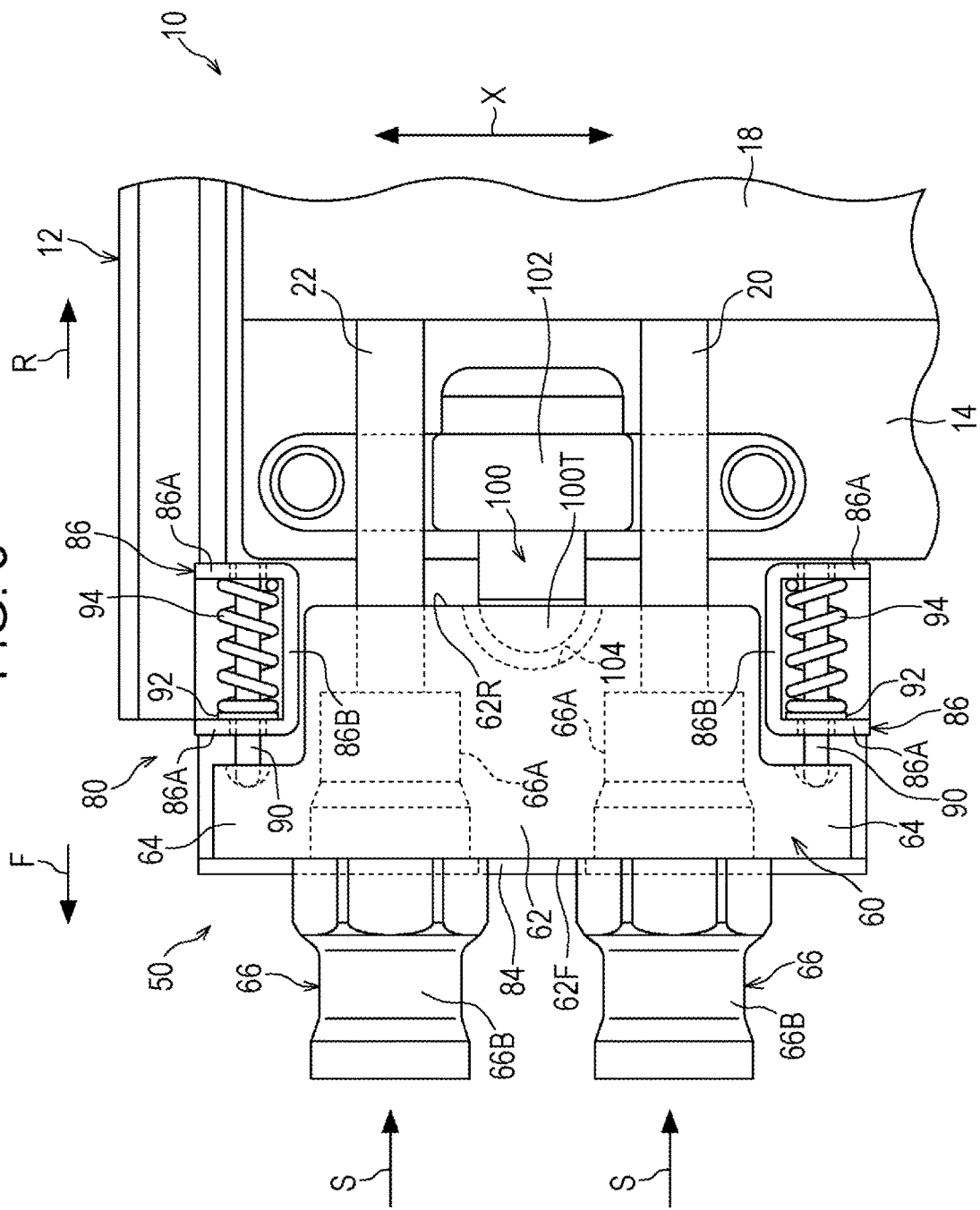
FIG. 3 is a plan view illustrating the fitting unit depicted in FIG. 2.

As illustrated in FIGS. 2 and 3, the fitting unit 50 includes a movable connector block 60, a floating support 80, and a protrusion or a fixed pin 100. Note that arrows F indicated in the drawings represent a front surface side of the movable connector block 60 and arrows R therein represent a rear surface side of the movable connector block 60. In the meantime, arrows X therein represent a horizontal direction of the movable connector block 60 and arrows Y therein represent a vertical direction of the movable connector block 60.

(Movable Connector Block)

The movable connector block 60 includes a connector header 62 and the pair of fluid connectors 66. The connector header 62 is formed into a block shape by use of a metal, for example. Moreover, the connector header 62 includes a pair of catching parts 64 which project to two sides in the horizontal direction (the direction of the arrow X). The connector header 62 is provided with the pair of fluid connectors 66. Note that each fluid connector 66 represents an example of a connector body.

The pair of fluid connectors 66 is formed into a cylindrical shape by use of a metal, for example. Each fluid connector 66 includes a pipe coupler 66A and a connector coupler 66B. The pipe coupler 66A is provided on one end side of the fluid connector 66 and is buried in the connector header 62. An end portion of the refrigerant supply pipe 20 or the refrigerant discharge pipe 22 is coupled to the pipe coupler 66A. The refrigerant supply pipe 20 and the refrigerant discharge pipe 22 extend out of a rear surface 62R of the connector header 62 and are connected to the cooler 18.

The connector coupler 66B is provided on the other end side of the fluid connector 66, and projects from a front surface 62F of the connector header 62. In other words, the fluid connectors 66 are provided on the front surface 62F side of the connector header 62. The fluid connectors 40 of the information processing device 30 are coupled to the connector couplers 66B in an attachable and detachable manner in the connector connecting direction (the direction of the arrows S).

Figure 4A:
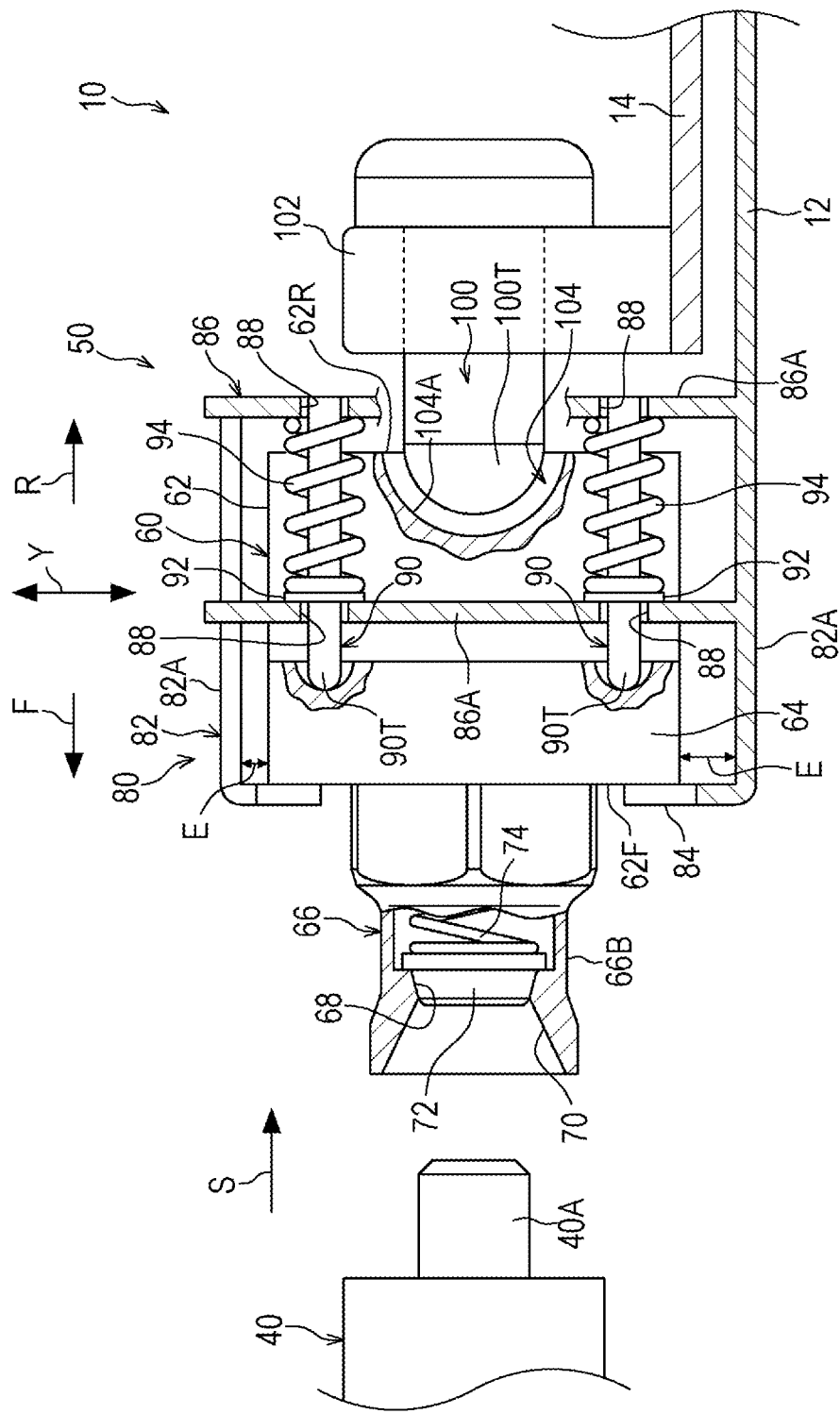
FIG. 4A is a side view illustrating a state before a fluid connector of the information processing device is connected to the fitting unit depicted in FIG. 2.

As illustrated in FIG. 4A, each connector coupler 66B is formed into a cylindrical shape. The connector coupler 66B includes a coupling port 68 and a guiding portion 70. A connection plug 40A of the fluid connector 40 to be described later is fitted into the coupling port 68. The guiding portion 70 is formed by chamfering a peripheral edge of the coupling port 68, for example. The guiding portion 70 is formed into an inclined surface (a tapered surface) so as to guide the connection plug 40A of the fluid connector 40 to the coupling port 68.

Meanwhile, the connector coupler 66B is provided with an on-off valve 72 to open and close the coupling port 68. The coupling port 68 is opened by pressing the on-off valve 72 deep into the connector coupler 66B with a tip end portion of the connection plug 40A, and the connection plug 40A is hence fitted into the opened coupling port 68.

Furthermore, the connector coupler 66B is provided with an elastic body 74 to support the on-off valve 72. The elastic body 74 is formed of a coil spring or an elastic rubber, for example, and is disposed on a rear surface side of the on-off valve 72. The elastic body 74 is contracted when the connection plug 40A presses the on-off valve 72 deep into the connector coupler 66B. On the other hand, when the connection plug 40A is pulled out of the coupling port 68, the on-off valve 72 returns to the original position (an initial position) by resilience of the elastic body 74, and the coupling port 68 is thus closed.

(Floating Support)

Figure 4B:
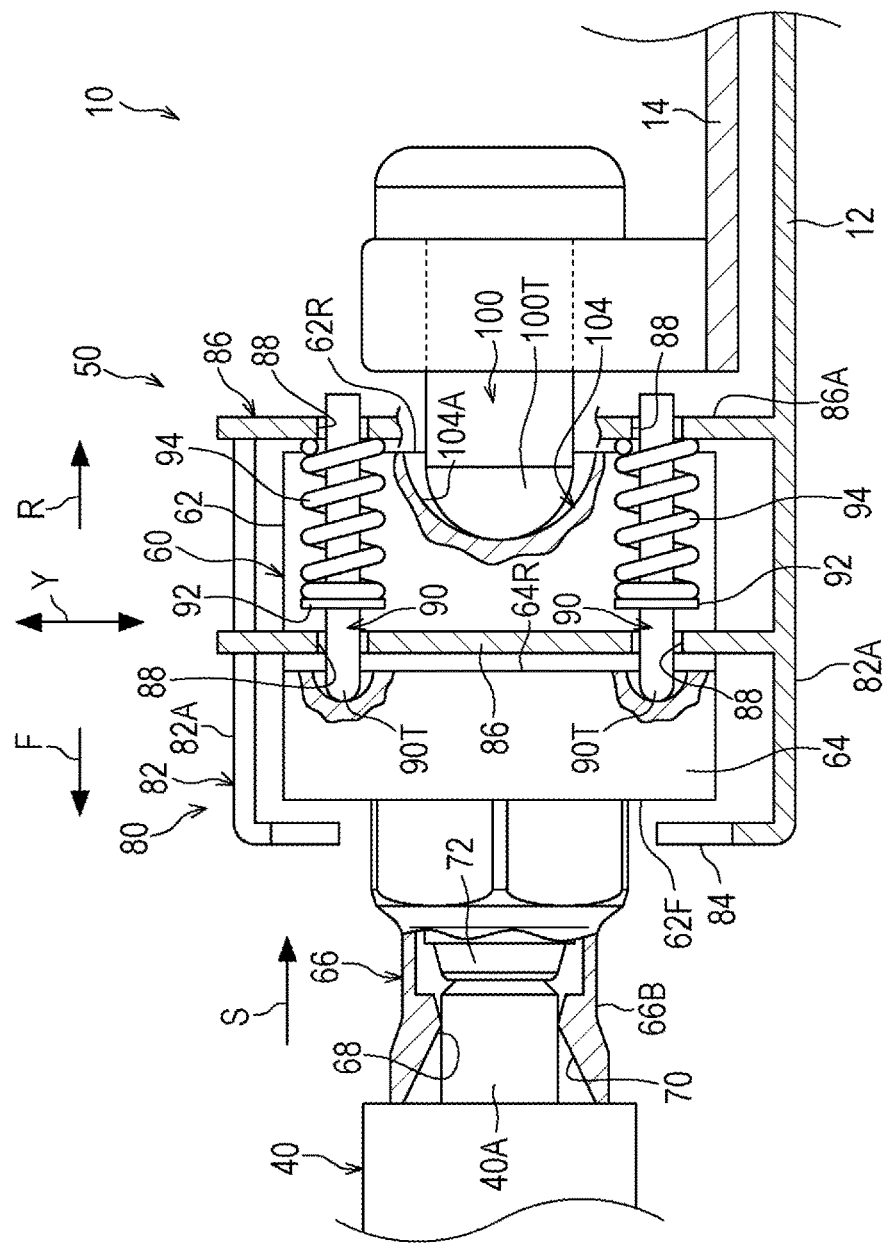
FIG. 4B is a side view illustrating a state after the fluid connector of the information processing device is connected to the fitting unit depicted in FIG. 2.

As illustrated in FIGS. 4A and 4B, the movable connector block 60 is swingably supported by the housing 12 of the electronic device 10 through the floating support 80. The floating support 80 supports the movable connector block 60 swingably (movably) in the connector connecting direction (the direction of the arrows S) as well as in directions orthogonal to the connector connecting direction relative to the housing 12 of the electronic device 10. Note that the directions orthogonal to the connector connecting direction in this embodiment mean the horizontal direction (the direction of the arrow X) of the movable connector block 60 and the vertical direction (the direction of the arrow Y) of the movable connector block 60, for example. Please note the embodiment disclosed here is a fluid connector for refrigerant in a cooling device, the disclosed floating support is also applicable to an electrical connector or the like.

The floating support 80 includes a floating holder 82, a pair of brackets 86, movable pins 90, and elastic members 94. The floating holder 82 is provided to the housing 12. The floating holder 82 includes a pair of holder bases 82A which is disposed on two sides in the vertical direction of the connector header 62. Note that illustration of the upper holder base 82A is omitted in FIGS. 2 and 3, and the like.

Restricting wall portions 84 that project to the front surface 62F side of the connector header 62 are provided to end portions on one side of the pair of holder bases 82A, respectively. The front surface 62F of the connector header 62 is brought into engagement in a direction (the direction of the arrow F) opposite to the connector connecting direction with the respective restricting wall portions 84. The restricting wall portions 84 restrict movement of the connector header 62 in the opposite direction to the connector connecting direction. Note that the restricting wall portions 84 represent an example of a restricting portion.

Figure 5:
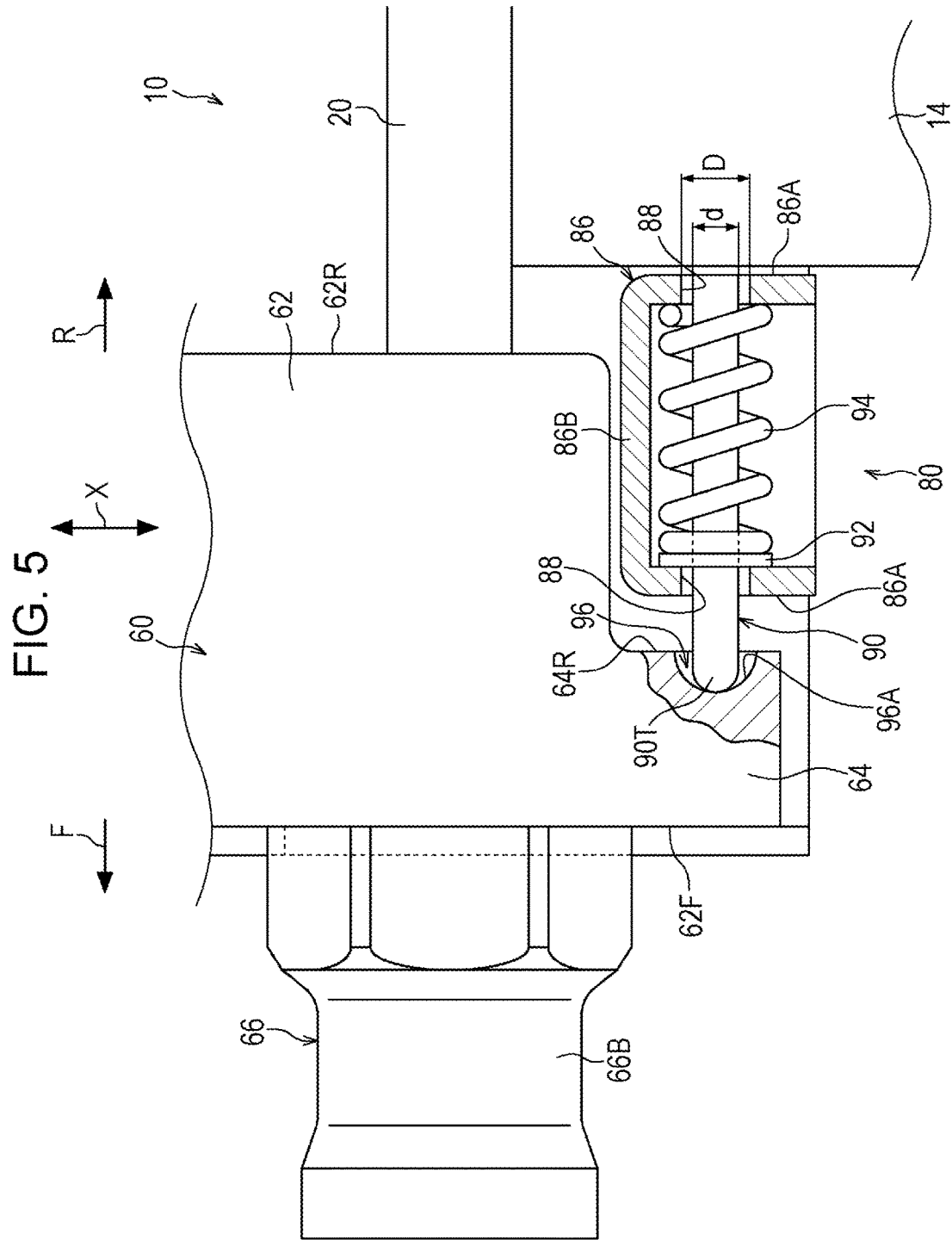
FIG. 5 is a partially enlarged plan view of FIG. 3 illustrating a movable pin.

As illustrated in FIG. 3, the pair of brackets 86 are disposed on a rear surface 64R side of the pair of catching parts 64 of the connector header 62, and are fixed to the floating holder 82 by use of not-illustrated screws and the like. As illustrated in FIG. 5, each bracket 86 includes a pair of opposed portions 86A opposed to each other in the connector connecting direction, and a connecting wall portion 86B to connect the pair of opposed portions 86A. In each opposed portion 86A, two through-holes 88 are formed at an interval in the vertical direction (the direction of the arrow Y) of the movable connector block 60. Note that illustration of the connecting wall portion 86B is omitted in FIGS. 4A and 4B, and the like.

Two or more (two in this embodiment) movable pins 90 are attached to each bracket 86. Each of the movable pins 90 is formed into a columnar shape, and is installed such that its axial direction is aligned with the connector connecting direction. Moreover, each movable pin 90 is inserted in such a way as to be slidable in the connector connecting direction into the corresponding through-holes 88 provided in the pair of opposed portions 86A, respectively.

Meanwhile, a diameter d of each movable pin 90 is made smaller than a diameter D of each through-hole 88. Thus, each movable pin 90 is made swingable inside the corresponding through-holes 88 in the horizontal direction and the vertical direction of movable connector block 60. The rear surface 64R of each catching part 64 is brought into contact in the connector connecting direction (the direction of the arrows S) with a tip end portion 90T of the corresponding movable pin 90. Note that the rear surface 64R of each catching part 64 represents an example of a rear surface of the movable connector block 60.

Each movable pin 90 is provided with a flange portion 92. The flange portion 92 is disposed between the pair of opposed portions 86A, and protrudes outward like a flange from an outer peripheral surface of the movable pin 90. The flange portion 92 is engaged with one of the opposed portions 86A which is located on the catching part 64 side. Thus, the movable pin 90 is kept from falling out of the through-hole 88 provided in the one opposed portion 86A in the opposite direction to the connector connecting direction. The movable pin 90 is supported by the bracket 86 through the corresponding elastic member 94.

Each elastic member 94 is a coil spring or an elastic rubber, for example, and is disposed such that its expanding direction is aligned with the connector connecting direction. The movable pin 90 is inserted into the elastic member 94. Meanwhile, the elastic member 94 is disposed in a contacted state between the flange portion 92 of the movable pin 90 and the other opposed portion 86A on the housing 12 side. The flange portion 92 of the movable pin 90 is biased toward the one opposed portion 86A by resilience (elasticity) of the elastic member 94. Thus, the tip end portion 90T of the movable pin 90 is brought into press-contact with the rear surface 64R of the catching part 64 of the connector header 62.

As a consequence, the connector header 62 moves in the opposite direction to the connector connecting direction relative to the floating holder 82 as illustrated in FIG. 4A. Then, the front surface 62F of the connector header 62 is engaged with the two restricting wall portions 84 of the floating holder 82. Thus, the movement of the movable connector block 60 in the opposite direction to the connector connecting direction is restricted. Note that in this embodiment, the state in which the front surface 62F of the connector header 62 is in press-contact with the restricting wall portions 84 is an initial state of the movable connector block 60.

Meanwhile, in the initial state of the movable connector block 60, friction developed between the front surface 62F of the connector header 62 and the restricting wall portions 84 allows to hold the connector header 62 while defining clearances E with the pair of the holder bases 82A, respectively. Thus, the movable connector block 60 is made swingable in the vertical direction (the direction of the arrow Y) relative to the floating holder 82. Here, as illustrated in FIG. 1, the movable connector block 60 in the initial state is also made swingable in the horizontal direction (the direction of the arrow X) relative to the floating holder 82.

On the other hand, when the connection plug 40A is pressed into the connector coupler 66B, the connector header 62 moves relative to the floating holder 82 in the connector connecting direction as illustrated in FIG. 4B. Accordingly, the rear surface 64R of the catching part 64 of the connector header 62 presses the tip end portion 90T of the movable pin 90 in the connector connecting direction. As a consequence, the movable pin 90 slides in the connector connecting direction relative to the bracket 86 against the resilience of the elastic member 94. As described above, the floating support 80 supports the movable connector block 60 swingably in the connector connecting direction relative to the housing 12.

Here, as illustrated in FIG. 5, the tip end portion 90T of each movable pin 90 is formed into a half-ball shape (a spherical shape). The tip end portions 90T of the movable pins 90 are inserted into movable-pin recesses 96 formed in the rear surfaces 64R of the catching parts 64. A bottom portion 96A of each movable-pin recess 96 is formed into a half-ball shape (a spherical shape). Meanwhile, a curvature radius of the bottom portion 96A of the movable-pin recess 96 is greater than a curvature radius of the tip end portion 90T of the movable pin 90. Thus, the movable connector block 60 can easily swing pivotally about the tip end portion 90T of the movable pin 90.

(Fixed Pin)

As illustrated in FIG. 3, the fixed pin 100 is formed into a columnar shape and is disposed such that its axial direction is aligned with the connector connecting direction. The fixed pin 100 is fixed to the printed wiring board 14 through a fixture 102. Note that the fixed pin 100 represents an example of a support portion.

Figure 6:
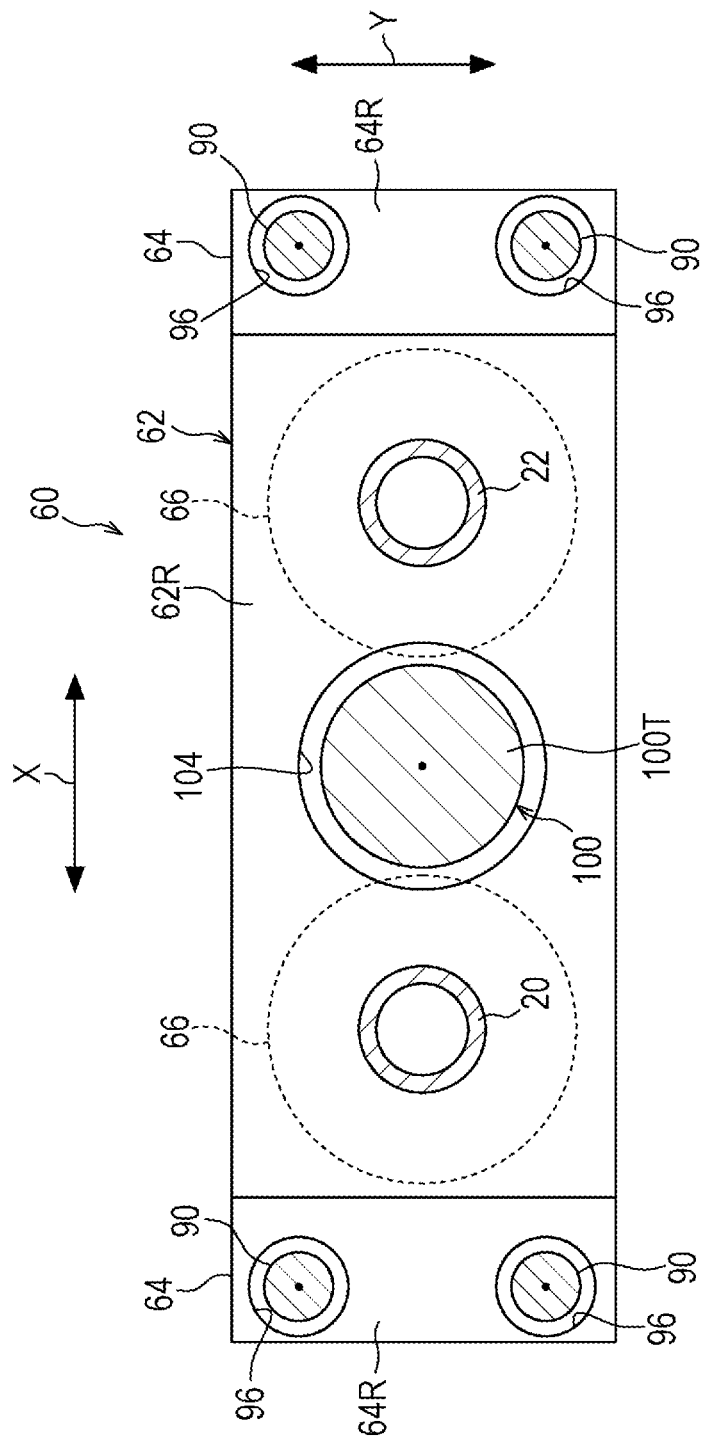
FIG. 6 is a rear view of a connector header depicted in FIG. 2, which is viewed from a rear side.

Meanwhile, as illustrated in FIG. 6, a tip end portion 100T of the fixed pin 100 is inserted into a fixed pin recess 104 formed in a central part of the connector header 62. The above-described movable pins 90 are disposed around the fixed pin 100. The tip end portions 90T of the movable pins 90 are inserted into the movable-pin recesses 96, respectively, which are formed at corners of the rear surfaces 64R of the catching parts 64.

Figure 7:
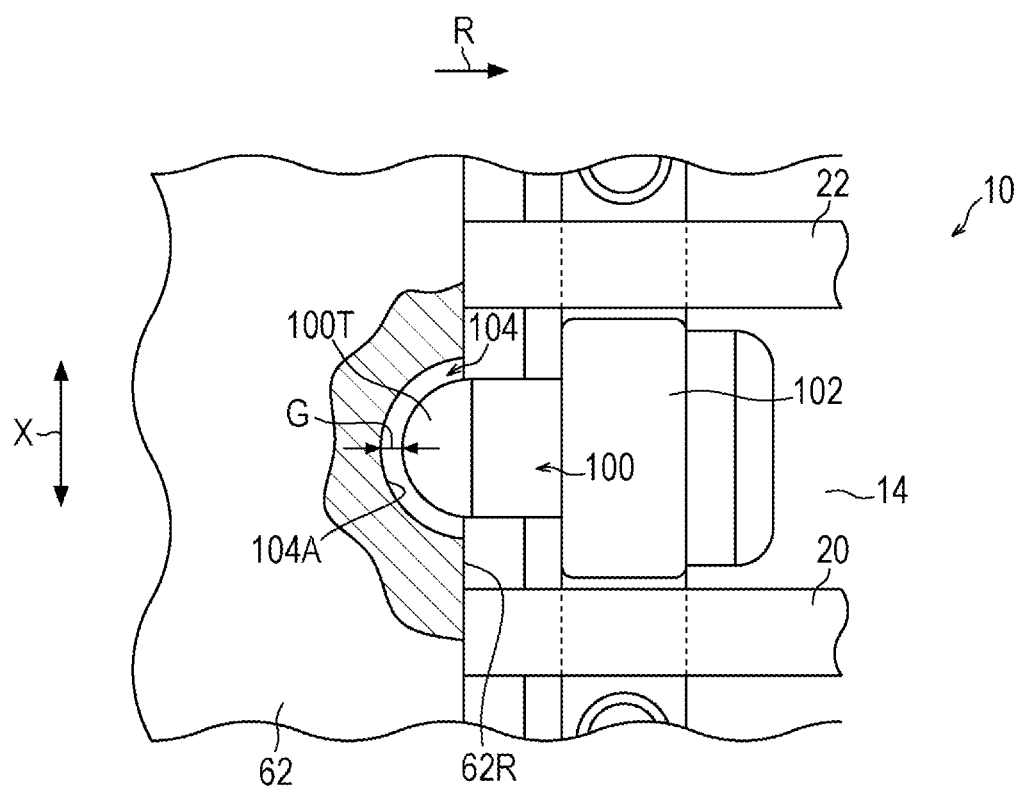
FIG. 7 is a partially enlarged plan view of FIG. 3 illustrating a fixed pin.

As illustrated in FIG. 7, the tip end portion 100T of the fixed pin 100 is formed into a half-ball shape (a spherical shape). Meanwhile, a bottom portion 104A of the fixed pin recess 104 is formed into a half-ball shape (a spherical shape). Furthermore, a curvature radius of the bottom portion 104A of the fixed pin recess 104 is greater than a curvature radius of the tip end portion 100T of the fixed pin 100. Thus, in the state where the bottom portion 104A of the fixed pin recess 104 is in contact with the tip end portion 100T of the fixed pin 100, the movable connector block 60 can easily swing pivotally about the tip end portion 100T of the fixed pin 100. Note that the rear surface 62R of the connector header 62 represents an example of the rear surface of the movable connector block 60. Meanwhile, the fixed pin recess 104 represents an example of a protruding-portion recess.

Here, in the initial state before the connection plug 40A is coupled to the connector coupler 66B, a clearance G is defined between the tip end portion 100T of the fixed pin 100 and the bottom portion 104A of the fixed pin recess 104. In other words, in the initial state, the movable connector block 60 is supported by the floating support 80 while retaining the clearance G between the bottom portion 104A of the fixed pin recess 104 and the tip end portion 100T of the fixed pin 100.

In the meantime, when the connector header 62 moves in the connector connecting direction along with the coupling of the connection plug 40A to the connector coupler 66B, the bottom portion 104A of the fixed pin recess 104 comes into contact in the connector connecting direction with the tip end portion 100T of the fixed pin 100. Thus, the connector header 62 is made swingable in the horizontal direction and the vertical direction (the directions of the arrows X and Y) of the movable connector block 60 and pivotally about the tip end portion 100T of the fixed pin 100.

Next, an example of a method of housing the electronic device 10 in the information processing device 30 will be described.

As illustrated in FIG. 1, the electronic device 10 is housed in the housing 32 of the information processing device 30 through the housing port 34 of the housing 32. Here, the electronic device 10 is housed in the housing 32 along the guide rail 36 of the housing 32. Thus, the electric connector 16 and the pair of fluid connectors 66 of the electronic device 10 are guided by the guide rail 36 to the electric connector 38 and the pair of fluid connectors 40 of the information processing device 30, respectively. Then, as the electronic device 10 is housed in the housing 32 of the information processing device 30, the electric connector 16 is connected to the electric connector 38, and the pair of fluid connectors 66 are connected to the pair of fluid connectors 40, respectively.

Now, a method of connecting the fluid connectors 66 of the electronic device 10 to the fluid connectors 40 of the information processing device 30 will be described in detail. First, a description will be given of a case illustrated in FIG. 4A, in which the connection plug 40A of each fluid connector 40 is inserted in the connector connecting direction (the direction of the arrow S) into the corresponding connector coupler 66B of the fluid connector 66.

When the connection plug 40A is inserted in the connector connecting direction into the connector coupler 66B as illustrated in FIG. 4A, the connection plug 40A comes into contact with on-off valve 72 that closes the coupling port 68 of the connector coupler 66B as illustrated in FIG. 4B. Here, the connection plug 40A is appropriately guided to the coupling port 68 by the guiding portion 70 of the connector coupler 66B.

In this state, when the connection plug 40A is inserted further into the connector coupler 66B, the movable pin 90 moves in the connector connecting direction against the resilience of the elastic member 94. Thus, the bottom portion 104A of the fixed pin recess 104 of the connector header 62 comes into contact with the tip end portion 100T of the fixed pin 100, and the movable connector block 60 is swingably supported by the tip end portion 100T.

In this state, when the connection plug 40A is inserted further into the connector coupler 66B, the on-off valve 72 is pressed deep into the connector coupler 66B by the connection plug 40A. Accordingly, the coupling port 68 is opened and the connection plug 40A is fitted into the coupling port 68. In this way, the connection plugs 40A are connected to the connector couplers 66B, and the refrigerant supply pipe 20 and the refrigerant discharge pipe 22 on the electronic device 10 side communicate with the refrigerant supply pipe 42 and the refrigerant discharge pipe 44 on the information processing device 30 side, respectively.

Next, a description will be given of a case illustrated in FIG. 8A, in which the connection plug 40A of each fluid connector 40 is inserted obliquely to the connector connecting direction (in a direction of an arrow V) into the corresponding connector coupler 66B of the fluid connector 66.

Figure 8A:
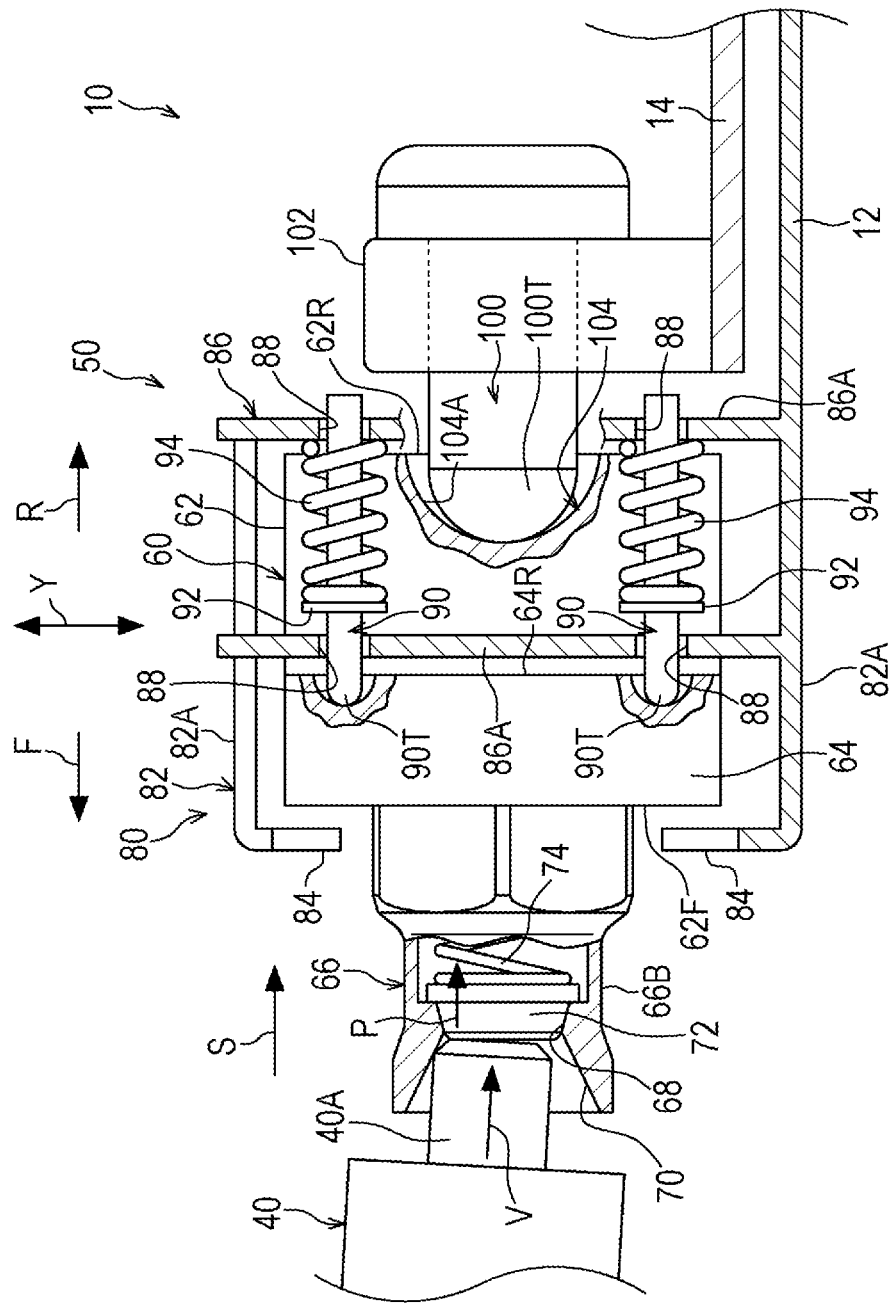
FIG. 8A is a side view illustrating a state before the fluid connector of the information processing device is connected to the fitting unit depicted in FIG. 2.

As illustrated in FIG. 8A, when the connection plug 40A is inserted obliquely to the connector connecting direction into the connector coupler 66B, the connection plug 40A obliquely comes into contact with on-off valve 72. In this state, when the connection plug 40A is inserted further into the connector coupler 66B, the movable pin 90 moves in the connector connecting direction against the resilience of the elastic member 94. Thus, the bottom portion 104A of the fixed pin recess 104 of the connector header 62 comes into contact with the tip end portion 100T of the fixed pin 100, and the movable connector block 60 is swingably supported by the tip end portion 100T.

Here, when the connection plug 40A is inserted obliquely to the connector connecting direction into the connector coupler 66B, the connection plug 40A thrusts an outer peripheral portion of the on-off valve 72 as indicated by an arrow P. Accordingly, as illustrated in FIG. 8B, the movable connector block 60 swings (turns) in a direction of an arrow R and pivotally about the tip end portion 100T of the fixed pin 100. As a consequence, the connector coupler 66B is oriented to the connection plug 40A, whereby the on-off valve 72 of the connector coupler 66B is aligned face-to-face with the connection plug 40A.

In this state, when the connection plug 40A is inserted further into the connector coupler 66B, the on-off valve 72 is pressed deep into the connector coupler 66B by the connection plug 40A. Accordingly, the coupling port 68 is opened and the connection plug 40A is fitted into the coupling port 68. In this way, the connection plugs 40A are connected to the connector couplers 66B, and the refrigerant supply pipe 42 and the refrigerant discharge pipe 44 of the information processing device 30 communicate with the refrigerant supply pipe 20 and the refrigerant discharge pipe 22 of the electronic device 10, respectively.

Next, effects of this embodiment will be described.

The floating support 80 supports the movable connector block 60 swingably in the connector connecting direction (the direction of the arrows S) as well as in the directions (the directions of the arrows X and Y) orthogonal to the connector connecting direction relative to the housing 12.

Accordingly, when the fluid connectors 40 of the information processing device 30 are connected to the fluid connectors 66 of the electronic device 10, the displacement of the connection plugs 40A relative to the connector couplers 66B is absorbed by the swinging action of the movable connector block 60. Thus, damage or the like of the connection plugs 40A and the connector couplers 66B is suppressed.

Moreover, in this embodiment, when the fluid connectors 40 and 66 are connected to one another, the electric connectors 16 and 38 are also connected to each other. In this case, by absorbing the displacement between the fluid connectors 40 and 66 with the swinging action of the movable connector block 60, displacement between the electric connectors 16 and 38 is also absorbed. Accordingly, in this embodiment, it is possible to connect the electric connectors 16 and 38 to each other in parallel with connecting the fluid connectors 40 and 66 to one another. As a consequence, man-hour to attach the electronic device 10 to the information processing device 30 is reduced.

Furthermore, in this embodiment, the bottom portion 104A of the fixed pin recess 104 and the tip end portion 100T of the fixed pin 100 are brought into contact with each other in the connector connecting direction in the state where the connection plugs 40A are coupled to the connector couplers 66B. Thus, the movable connector block 60 is made swingable pivotally about the tip end portion 100T of the fixed pin 100.

For this reason, in the state where each connection plug 40A is connected to the corresponding connector coupler 66B, the following outcomes are brought about when the connection plug 40A is displaced relative to the connector coupler 66B due to vibration of the information processing device 30 or other reasons. Specifically, the movable connector block 60 swings pivotally about the tip end portion 100T of the fixed pin 100 along with the displacement of the connection plug 40A. In this way, the movable connector block 60 follows the displacement of the connection plug 40A. Thus, damage or the like of the connection plugs 40A and the connector couplers 66B is suppressed.

In particular, a junction between the connection plug 40A and the connector coupler 66B is preferably provided with high connection accuracy (fitting accuracy) in order to reduce leakage of the refrigerant and the like. In this regard, if the connection plug 40A is displaced relative to the connector coupler 66B due to the vibration of the information processing device 30 or other reasons, the refrigerant may be leaked from the junction between the connection plug 40A and the connector coupler 66B.

Meanwhile, in this embodiment, the movable connector block 60 swings pivotally about the tip end portion 100T of the fixed pin 100 along with the displacement of the connection plug 40A as described previously. Accordingly, an amount of displacement between the connection plug 40A and the connector coupler 66B is reduced. As a consequence, the leakage of the refrigerant from the junction between the connection plug 40A and the connector coupler 66B is suppressed.

In the meantime, the tip end portion 100T of the fixed pin 100 is formed into the half-ball shape. Likewise, the bottom portion 104A of the fixed pin recess 104 is formed into the half-ball shape. In this way, the movable connector block 60 can easily swing in the horizontal direction and the vertical direction of the movable connector block 60 and pivotally about the tip end portion 100T of the fixed pin 100. Thus, damage or the like of the connection plugs 40A and the connector couplers 66B is further suppressed.

Moreover, the tip end portion 90T of each movable pin 90 is formed into the half-ball shape. Likewise, the bottom portion 96A of each movable-pin recess 96 is formed into the half-ball shape. In this way, when the movable connector block 60 swings pivotally about the tip end portion 100T of the fixed pin 100, the movable connector block 60 can easily slide relative to the tip end portion 90T of the movable pin 90. Accordingly, the movable connector block 60 can more easily swing pivotally about the tip end portion 100T of the fixed pin 100. Thus, damage or the like of the connection plugs 40A and the connector couplers 66B is further suppressed.

Meanwhile, in the initial state before the connection plugs 40A are connected to the connector couplers 66B, the front surface 62F of the connector header 62 is brought into press-contact with the restricting wall portions 84 of the floating holder 82 by the resilience of the elastic members 94. Thus, the movable connector block 60 is held at a predetermined position (an initial position). Accordingly, positioning accuracy between the each connection plug 40A and the corresponding connector coupler 66B is improved.

Here, if the bottom portion 104A of the fixed pin recess 104 is in contact with the tip end portion 100T of the fixed pin 100 in the above-mentioned initial state, for example, then the movable connector block 60 swings relative to the housing 12 less easily due to friction developed between the bottom portion 104A and the tip end portion 100T.

On the other hand, in this embodiment, the clearance G is defined between the bottom portion 104A of the fixed pin recess 104 and the tip end portion 100T of the fixed pin 100 in the initial state as described above. This makes it easier for the movable connector block 60 to swing relative to the housing 12 in the initial state. As a consequence, the displacement of each connection plug 40A relative to the corresponding connector coupler 66B can be absorbed easily.

Next, modified examples of the above-mentioned embodiment will be described.

In the above-mentioned embodiment, the clearance G is defined between the bottom portion 104A of the fixed pin recess 104 and the tip end portion 100T of the fixed pin 100 in the initial state of the movable connector block 60. Nonetheless, the bottom portion 104A of the fixed pin recess 104 may be brought into contact with the tip end portion 100T of the fixed pin 100 in the initial state.

Here, when the movable connector block 60 moves in the connector connecting direction along with the connection of the connector couplers 66B to the connection plugs 40A, stress may be developed in the refrigerant supply pipe 20 and the refrigerant discharge pipe 22 which are connected to the movable connector block 60. Particularly, when the refrigerant supply pipe 20 and the refrigerant discharge pipe 22 are each made of a metal pipe and the like, the stress to be developed in the refrigerant supply pipe 20 and the refrigerant discharge pipe 22 tends to be large.

On the other hand, if the bottom portion 104A of the fixed pin recess 104 is in contact in the connector connecting direction with the tip end portion 100T of the fixed pin 100 in the initial state of the movable connector block 60, then the movable connector block 60 does not move in the connector connecting direction or an amount of movement thereof is reduced. In this way, the stress to be developed in the refrigerant supply pipe 20 and the refrigerant discharge pipe 22 is reduced. Thus, damage or the like of the refrigerant supply pipe 20 and the refrigerant discharge pipe 22 is suppressed.

Although the bottom portion 104A of the fixed pin recess 104 is formed into the half-ball shape in the above-described embodiment, the bottom portion 104A may be formed into a flat surface instead. In addition, although the fixed pin recess 104 is formed in the rear surface 62R of the connector header 62 in the above-described embodiment, the fixed pin recess 104 may be omitted. Here, if the fixed pin recess 104 is omitted, then the tip end portion 100T of the fixed pin 100 is brought into contact with the rear surface 62R of the connector header 62.

Meanwhile, in this embodiment, the fixed pin 100 is provided to the printed wiring board 14 serving as the base. However, the fixed pin 100 may be fixed to the housing 12 serving as the base instead.

Figure 9:
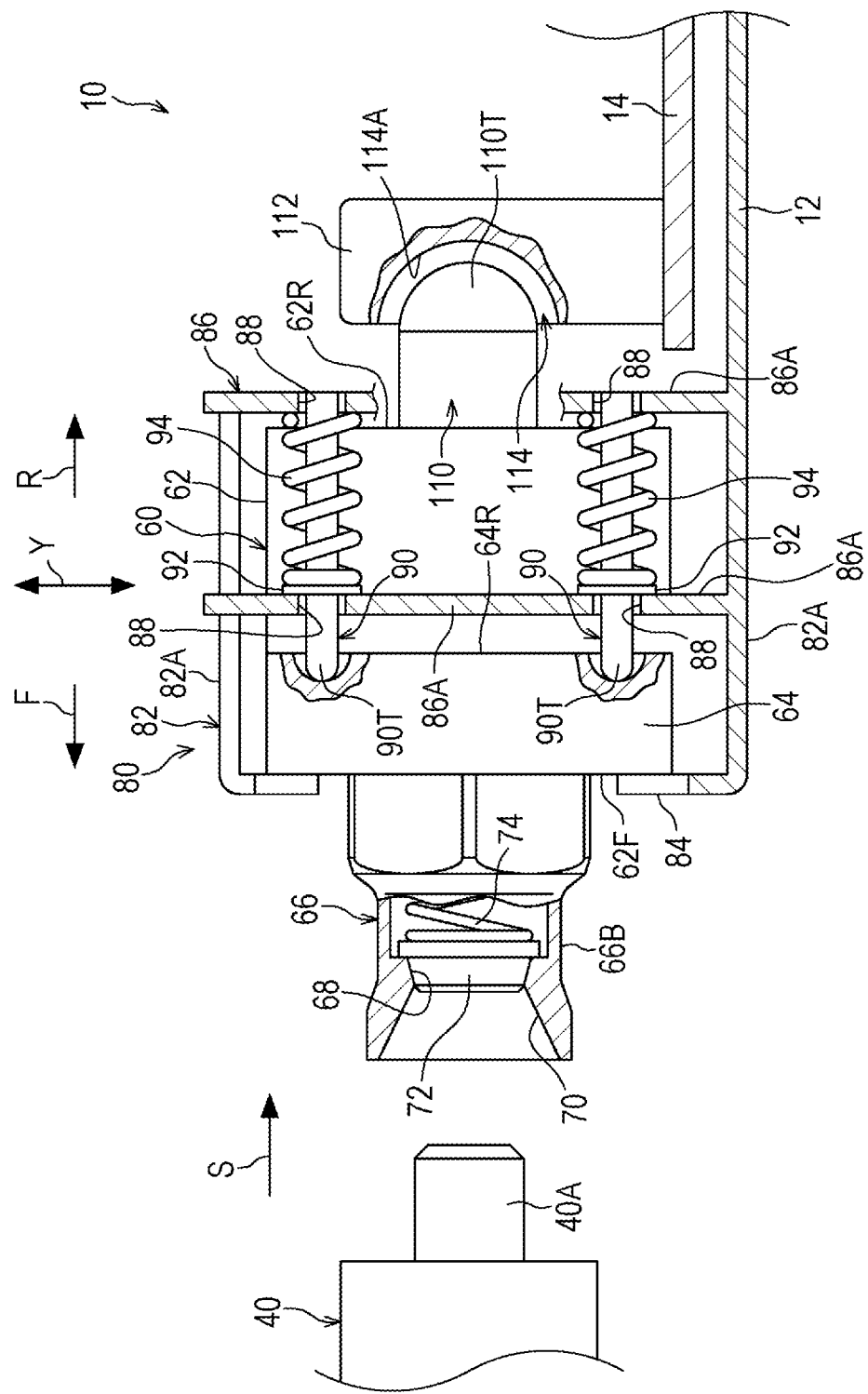
FIG. 9 is a side view illustrating a modified example of the fixed pin, which is the view equivalent to FIG. 4A.

Alternatively, as in a modified example illustrated in FIG. 9, a fixed pin 110 may be provided to the rear surface 62R of the connector header 62 of the movable connector block 60. A tip end portion 110T of the fixed pin 110 is formed into a half-ball shape. Meanwhile, in the state where the connection plugs 40A are connected to the connector couplers 66B, the tip end portion 110T of the fixed pin 110 is brought into contact in the connector connecting direction with a base 112 provided to the printed wiring board 14. In this way, the movable connector block 60 is supported by the tip end portion 110T of the fixed pin 110, and is made swingable relative to the printed wiring board 14 and pivotally about the tip end portion 110T. As a consequence, the same effects as those of the above-described embodiment can be achieved.

Note that in the modified example illustrated in FIG. 9, the tip end portion 110T of the fixed pin 110 is inserted into a fixed pin recess 114 formed in the base 112. Moreover, a bottom portion 114A of the fixed pin recess 114 is formed into a half-ball shape. Thus, the movable connector block 60 can easily swing pivotally about the tip end portion 110T of the fixed pin 110.

Meanwhile, the floating support 80 of the above-described embodiment supports the movable connector block 60 swingably in the connector connecting direction as well as in the directions orthogonal to the connector connecting direction relative to the housing 12. However, the floating support 80 may support the movable connector block 60 in such a way as to be swingable at least in the connector connecting direction relative to the housing 12.

In the meantime, the configuration of the floating support 80 may be changed as appropriate. For example, the movable-pin recesses 96 may be omitted. In this case, the tip end portion 90T of each movable pin 90 is brought into contact with the rear surface 64R of the catching part 64.

Meanwhile, in the above-described embodiment, the movable pins 90 and the elastic members 94 are provided to the housing 12. However, such movable pins and elastic members may be provided to the movable connector block 60 instead. In this case, a tip end portion of each movable pin is brought into contact with the housing 12 serving as the base, for example.

In the meantime, the movable pins 90 may be omitted, for example. In this case, the elastic members are brought into contact directly with the rear surface 62R of the connector header 62. In this case as well, the movable connector block 60 is supported by the housing 12 serving as the base through the elastic members. Furthermore, the restricting wall portions 84 of the floating holder 82 may be omitted. In this case, the initial state of the movable connector block 60 is established when each elastic member is at its natural length.

Meanwhile, although the connector header 62 is provided to the movable connector block 60 in the above-described embodiment, the connector header 62 may be omitted. Specifically, the movable connector block 60 may at least include the fluid connectors 66. In the meantime, the above-described embodiment is applicable not only to the fluid connectors 66, but also to various connectors such as electric connectors.

While a certain embodiment of the technique disclosed in this application has been described above, it is to be understood that the technique disclosed in this application is not limited to the above-described embodiment. It is needless to say that the above-described embodiment and the various modified examples may be combined as appropriate, and that the technique disclosed in this application may be embodied in various other aspects within the scope not departing from the gist of the technique disclosed in this application.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A fitting assembly comprising:
 a movable connector block including a connector coupler to which a connector is to be coupled, the movable connector block configured to be supported by a base;
 a floating support connected to the movable connector block and supports the movable connector block swingably relative to the base; and
 a protrusion provided to one of the movable connector block and the base, the protrusion including a tip end formed into a half-ball shape that, when the connector is coupled to the connector coupler, comes into contact, in a connecting direction to the connector, with the other one of the movable connector block and the base, and swingably supports the movable connector block pivotally about the tip end, wherein
 the other one of the movable connector block and the base includes a protrusion-receiving recess into which the tip end of the protrusion is inserted, a bottom of the protrusion-receiving recess is formed into a half-ball shape having a curvature radius greater than a curvature radius of the tip end of the protrusion.

2. The fitting assembly according to claim 1, wherein the floating support supports the movable connector block swingably in the connecting direction and in a direction orthogonal to the connecting direction relative to the base.

3. The fitting assembly according to claim 1, wherein the protrusion is a fixed pin disposed such that an axial direction of the fixed pin is aligned with the connecting direction.

4. The fitting assembly according to claim 1, wherein
the connector coupler is provided on a front surface side of the movable connector block, and
the protrusion is provided to the base and configured to support a rear surface of the movable connector block by using the tip end of the protrusion.

5. The fitting assembly according to claim 1, wherein
the floating support includes an elastic disposed such that an expanding direction of the elastic is aligned with the connecting direction, and
the movable connector block is supported by the base through the elastic.

6. The fitting assembly according to claim 5, wherein the floating support includes a movable pin supported by one of the movable connector block and the base through the elastic, and including a tip end of the movable pin configured to support the other one of the movable connector block and the base.

7. The fitting assembly according to claim 6, wherein the tip end of the movable pin is formed into a half-ball shape.

8. The fitting assembly according to claim 6, wherein the other one of the movable connector block and the base includes a movable-pin-receiving recess into which the tip end of the movable pin is inserted, a bottom of the movable-pin-receiving recess is formed into a half-ball shape.

9. The fitting assembly according to claim 8, wherein a curvature radius of the bottom of the movable-pin-receiving recess is greater than a curvature radius of the tip end of the movable pin.

10. The fitting assembly according to claim 6, wherein
the connector coupler is provided on a front surface side of the movable connector block, and
the movable pin is provided to the base and configured to support a rear surface of the movable connector block by using the tip end of the movable pin.

11. The fitting assembly according to claim 6, wherein a plurality of
the elastics and a plurality of the movable pins are provided around the protrusion.

12. The fitting assembly according to claim 5, wherein
the floating support includes a restricting attached to the base and configured to restrict movement of the movable connector block in a direction opposite to the connecting direction, and
the elastic biases the movable connector block toward the restricting.

13. The fitting assembly according to claim 1, wherein
in a state before the connector is coupled to the connector coupler, the floating support supports the movable connector block with a clearance provided between the tip end of the protrusion and the other one of the movable connector block and the base, and
the tip end of the protrusion is brought into contact with the other one of the movable connector block and the base at when the connector is coupled to the connector coupler.

14. The fitting assembly according to claim 1, wherein the connector coupler includes:
a coupling port into which the connector is to be fitted; and
a guiding portion extending outward from a peripheral edge of the coupling port, and configured to guide the connector to the coupling port.

15. The fitting assembly according to claim 1, wherein
the movable connector block includes:
a connector header configured to be supported by the base through the floating support; and
a connector body provided to the connector header and including the connector coupler, and
the protrusion is provided to one of the connector header and the base, and
configured to support the other one of the connector header and the base by using the tip end of the protrusion.

16. The fitting assembly according to claim 15, wherein the connector body is a fluid connector to which piping to feed a fluid is to be connected.

17. An electronic device comprising:
an electronic component;
a housing including a base and housing the electronic component;
a movable connector block including a connector coupler to which a connector is to be coupled, the movable connector being supported by the base;
a floating support connected to the movable connector block and supports the movable connector block swingably relative to the base; and
a protrusion provided to one of the movable connector block and the base, the protrusion including a tip end formed into a half-ball shape that, when the connector is coupled to the connector coupler, comes into contact, in a connecting direction with the connector, with the other one of the movable connector block and the base, and swingably supports the movable connector block pivotally about the tip end, wherein
the other one of the movable connector block and the base includes a protrusion-receiving recess into which the tip end of the protrusion is inserted, a bottom of the protrusion-receiving recess is formed into a half-ball shape having a curvature radius greater than a curvature radius of the tip end of the protrusion.

\* \* \* \* \*